United States Patent [19]

Shoji

[11] Patent Number: 4,900,912

[45] Date of Patent: Feb. 13, 1990

[54] DRIVER CIRCUIT FOR SEMICONDUCTOR LIGHT-EMITTING DEVICE

[75] Inventor: Takashi Shoji, Kanagawa, Japan

[73] Assignee: Fuji Photo Film Co., Ltd., Kanagawa, Japan

[21] Appl. No.: 293,856

[22] Filed: Jan. 5, 1989

[30] Foreign Application Priority Data

Mar. 18, 1988 [JP] Japan ................................ 63-64912

[51] Int. Cl.⁴ .............................................. G01J 1/32
[52] U.S. Cl. ................................................... 250/205
[58] Field of Search ........... 250/205, 208, 209, 214 R; 307/311; 357/19

[56] References Cited

U.S. PATENT DOCUMENTS

| | | | |
|---|---|---|---|
| 4,686,425 | 8/1987 | Havel | 250/205 |
| 4,712,000 | 12/1987 | Yoshikawa et al. | 250/205 |
| 4,743,749 | 5/1988 | Grundy | 250/209 |

Primary Examiner—David C. Nelms
Assistant Examiner—William Oen
Attorney, Agent, or Firm—Sughrue, Mion, Zinn, Macpeak & Seas

[57] ABSTRACT

A driver circuit for driving a semiconductor light-emitting device such as a semiconductor laser includes a voltage-controlling amplifier for controlling a light-emitting current which enables the semiconductor light-emitting device to emit light. The output voltage of the voltage-controlling amplifier is dependent on a light-quantity command voltage signal applied thereto. Since the light-emitting current can be directly varied by the voltage-controlling amplifier, the quantity of the emitted light can vary with a sufficiently fast response to follow the light-quantity command signal. The quantity of the emitted light is maintained at the level of the light-quantity command signal under feedback control by a current-controlling amplifier.

7 Claims, 5 Drawing Sheets

F I G. 2A
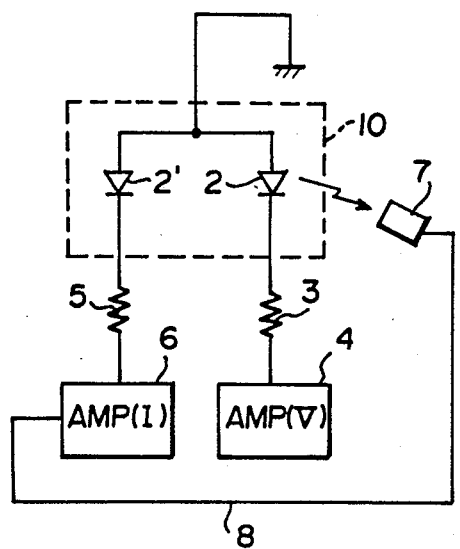
F I G. 2B
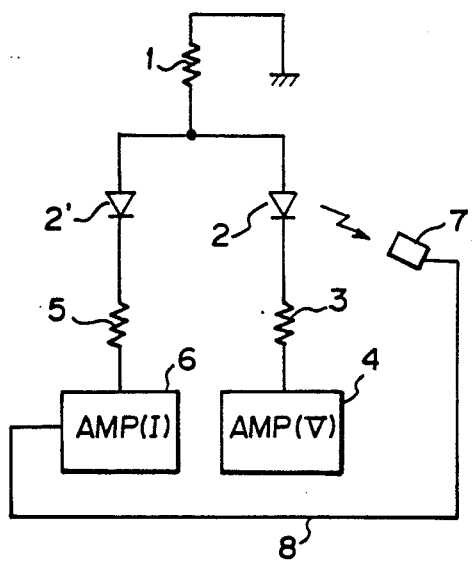

F I G. 4A
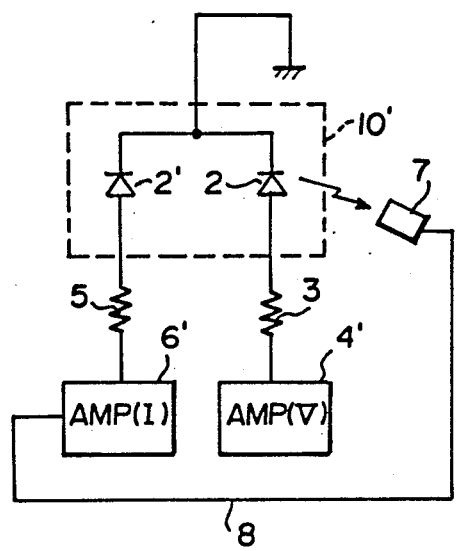
F I G. 4B
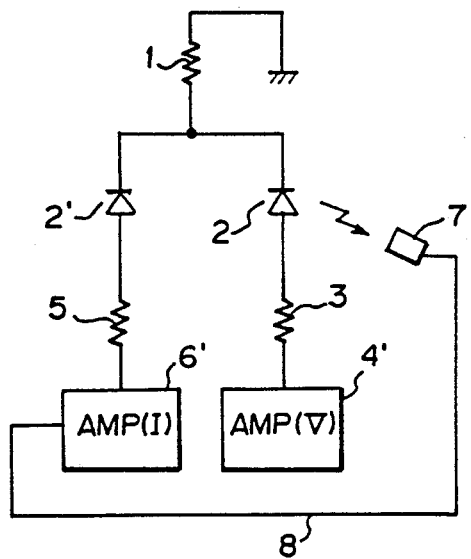

DRIVER CIRCUIT FOR SEMICONDUCTOR LIGHT-EMITTING DEVICE

BACKGROUND OF THE INVENTION

1. Field of the Invention

The present invention relates to a driver circuit for driving a semiconductor light-emitting device for use in a light scanning recording apparatus, an optical communication system, or the like, and more particularly to a driver circuit for controlling a semiconductor light-emitting device to produce varying optical outputs with increased response.

2. Description of the Prior Art

There have widely been put to use light scanning recording apparatuses, which include light deflectors for deflecting a light beam to scan a photosensitive recording medium to record information thereon. Optical communication systems for transmitting an optical signal through an optical fiber have also been employed in practice. A semiconductor light-emitting device such as a semiconductor laser or a light-emitting diode, for example, has heretofore been used as one of the light sources for emitting light beams in such light scanning recording apparatuses and optical communication systems. The semiconductor light-emitting device has numerous advantages in that it is small in size, inexpensive, has a low power requirement, and can directly modulate an output laser beam by varying a drive current supplied thereto.

The semiconductor light-emitting device is energized by a driver circuit which is normally combined with an automatic power control (APC) circuit to control the light-emitting circuit to produce the exact quantity of light indicated by a light-quantity command signal for light output stability control. The conventional APC circuit detects either the quantity of light emitted backwards from the semiconductor light-emitting device (i.e., light emitted in a direction opposite to the direction of the light beam emitted for recording an image or the like, hereinafter referred to as the forwardly emitted light beam), or the quantity of light branched off from the forwardly emitted light beam by a half-silvered mirror or the like, and controls a drive current, which is supplied to the semiconductor light-emitting device, so as to eliminate any difference between the detected quantity of light and a targent quantity of light represented by the light-quantity command signal.

The quantity of light emitted backwards from the semiconductor light-emitting device or the quantity of light branched from the forwardly emitted light beam is considerably smaller than the total quantity of light emitted by the semiconductor light-emitting device. Since the level of a feedback signal used for the light output stability control tends to be low, it is necessary to greatly amplify the feedback signal. This requires a number of amplifying stages to be employed in the amplifier, and causes a large phase delay in the light-quantity control system. For this reason, it has proven difficult to employ a wide frequency band in the feedback control loop in the light-quantity control system, resulting in a poor control response.

The poor control response is problematic in that if the level of the light-quantity command signal varies stepwise up or down, then a certain time lag is experienced before the quantity of light emitted from the semiconductor light-emitting device reaches the new level of the light-quantity command signal, and this time lag presents a major obstacle to high-speed operation of the light scanning recording apparatus, the optical communication system, or the like in which the semiconductor light-emitting device is incorporated.

SUMMARY OF THE INVENTION

In view of the aforesaid problems, it is an object of the present invention to provide a driver circuit for making the quantity of light emitted from a semiconductor light-emitting device equal to the quantity indicated by a light-quantity command signal and to improve the response time of said driver circuit.

According to a first aspect of the present invention, there is provided a driver circuit for a semiconductor light-emitting device, comprising: a first current path comprising a first resistor having one end kept at a predetermined voltage level, a semiconductor light-emitting device having an anode connected to the other end of said resistor, a second resistor having one end connected to the cathode of said semiconductor light-emitting device, and a voltage-controlling amplifier having an output terminal connected to the other end of said second resistor; a second current path comprising said first resistor, a third resistor having one end connected to a junction between said other end of said first resistor and said anode of said semiconductor light-emitting device, and a current-controlling amplifier having an output terminal connected to the other end of said third resistor; a light detector for monitoring the intensity of light emitted from said semiconductor light-emitting device; and a feedback path connecting an output terminal of said light detector to an input terminal of said current-controlling amplifier, said voltage-controlling amplifier drawing a current which enables said semiconductor light-emitting device to emit light so that an output voltage of said voltage-controlling amplifier is of a prescribed value dependent on an input signal applied to the voltage-controlling amplifier, said current-controlling amplifier drawing a current corresponding to the difference between an output signal applied from said light detector to said current-controlling amplifier and a reference signal applied to the current-controlling amplifier so that said intensity of light is maintained at a prescribed intensity level.

The driver circuit may include a plurality of semiconductor light-emitting devices contained in a single chip and having a common anode, said anode being kept at said predetermined voltage level, said semiconductor light-emitting devices including first and second semiconductor light-emitting devices, said first current path comprising said first semiconductor light-emitting device, said second resistor, and said voltage-controlling amplifier, said second resistor and said voltage-controlling amplifier being connected to the cathode of said first semiconductor light-emitting device, said second current path comprising said second semiconductor light-emitting device, said third resistor and said current-controlling amplifier, said third resistor and said current-controlling amplifier being connected to the cathode of said second semiconductor light-emitting device.

According to a second aspect of the present invention, the anode and cathode of the semiconductor light-emitting device according to the first aspect are inversely connected, and said voltage-controlling amplifier issues a current which enables said semiconductor light-emitting device to emit light so that an output voltage of said voltage-controlling amplifier is of a prescribed value dependent on an input signal applied to the voltage-controlling amplifier, and said current-controlling amplifier issues a current corresponding to the difference between an output signal applied from said light detector to said current-controlling amplifier and a reference signal applied to the current-controlling amplifier so that said intensity of said emitted light is maintained at a prescribed intensity level, so that currents flow in the directions opposite to the directions in which currents flow in the first aspect of the invention.

The driver circuit of the second aspect may also include a plurality of semiconductor light-emitting devices contained in a single chip and having a common cathode, said cathode being kept at said predetermined voltage level, said semiconductor light-emitting devices including first and second semiconductor light-emitting devices, said first current path comprising said first semiconductor light-emitting device, said second resistor, and said voltage-controlling amplifier, said second resistor and said voltage-controlling amplifier being connected to the anode of said first semiconductor light-emitting device, said second current path comprising said second semiconductor light-emitting device, said third resistor, and said current-controlling amplifier, said third resistor and said current-controlling amplifier being connected to the anode of said second semiconductor light-emitting device.

The semiconductor light-emitting device or each of the semiconductor light-emitting devices comprises a semiconductor laser.

In the driver circuit according to the first aspect of the invention, a current flowing through the first resistor is divided into a light-emitting current which passes through the semiconductor light-emitting device to enable the same to emit light, then through the second resistor, and is drawn into the voltage-controlling amplifier, and a control current which passes through the third resistor and is drawn into the current-controlling amplifier.

In the event that the intensity of light emitted from the semiconductor light-emitting device and detected by the light detector is increased, an output signal from the light detector which corresponds to the detected light intensity is fed back through the feedback path to the current-controlling amplifier to make the current-controlling amplifier draw more control current, dependent on the difference between the output signal from the light detector and the reference signal.

When the control current increases, the current flowing through the first resistor increases, resulting in a larger potential difference across the first resistor. Therefore, the light-emitting current decreases, and so does the quantity of the emitted light.

If the quantity of light emitted from the semiconductor light-emitting device is lowered, the driver circuit controls the current-controlling amplifier in the manner opposite to the described above. Therefore, the quantity of the emitted light will always be maintained at a prescribed level. The reference signal applied to the current-controlling amplifier and the input signal applied to the voltage-controlling amplifier are kept at respective constant levels during the above control operation.

For varying the quantity of the emitted light in a stepwise manner, for example, the reference signal applied to the current-controlling amplifier and the input signal applied to the voltage-controlling amplifier may be varied in a stepwise manner. By doing so, the output voltage from the voltage-controlling amplifier is varied stepwise to vary the light-emitting current stepwise, which in turn varies the quantity of the emitted light in a stepwise manner. The quantity of the emitted light is then maintained at the desired level under feedback control, wherein any difference between the varying reference signal applied to the current-controlling amplifier and the output signal from the light detector is detected.

In the driver circuit according to the second aspect of the present invention, the light-emitting current flowing from the voltage-controlling amplifier flows through the second resistor and the semiconductor light-emitting device into the first resistor, and the control current flowing from the current-controlling amplifier flows through the third resistor into the first resistor. Therefore, by controlling the magnitude of the control current flowing from the current-controlling amplifier, which control current is dependent on the difference between the output signal from the light detector and the reference signal, the potential difference across the first resistor changes, which affects the light-emitting current, thereby controlling the quantity of the emitted light.

To vary the quantity of the emitted light in a stepwise manner, for example, the reference signal applied to the current-controlling amplifier and the input signal applied to the voltage-controlling amplifier may be varied in a stepwise manner. The output voltage from the voltage-controlling amplifier is then varied stepwise to vary the quantity of the emitted light in a stepwise fashion.

According to the present invention, as described above, since the light-emitting current depends directly on the input signal applied to the voltage-controlling amplifier, the response of a variation in the quantity of the emitted light to a change in a light quantity command signal is sufficiently faster than it would have been if the quantity of the emitted light were varied by feedback control (corresponding to control of the quantity of light emitted using only the current-controlling amplifier).

Where a plurality of semiconductor light-emitting devices contained in one chip and having a common anode or cathode are employed, the common anode or cathode in the chip equivalently provides the first resistor. Consequently, the number of parts needed to construct the driver circuit is reduced, making the driver circuit compact.

The driver circuit is particularly effective to stably control optical outputs having high energy levels, such as the outputs from semiconductor lasers.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 2A is a circuit diagram, partly in block diagram form, of a portion of a driver circuit according to a modification of the first embodiment;

FIG. 2B is a circuit diagram showing an equivalent circuit of the driver circuit illustrated in FIG. 2A;

FIG. 4A is a circuit diagram, partly in block diagram form, of a portion of a driver circuit according to a modification of the second embodiment;

FIG. 4B is a circuit diagram showing an equivalent circuit of the driver circuit illustrated in FIG. 4A.

DESCRIPTION OF THE PREFERRED EMBODIMENTS

Figure 1:
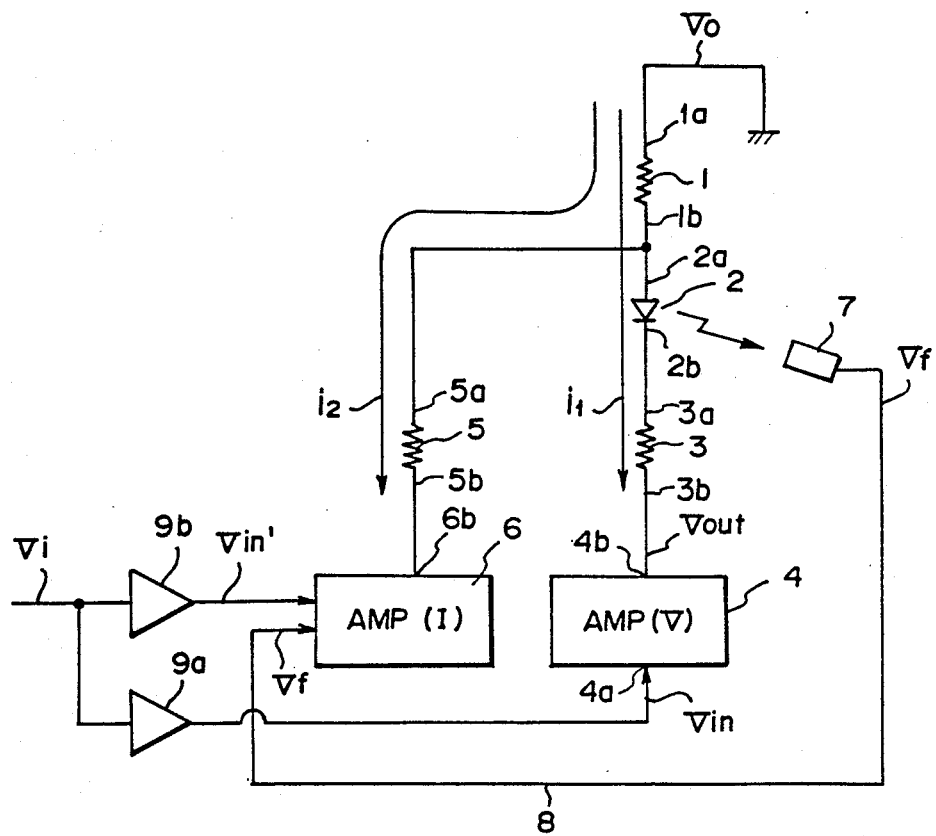
FIG. 1 is a circuit diagram, partly in block diagram form, of a driver circuit according to a first embodiment of the present invention.

FIG. 1 shows a driver circuit according to a first embodiment of the present invention.

A resistor 1 has one end 1a grounded and the other end 1b connected to the anode 2a of a semiconductor laser 2 and one end 5a of a resistor 5. The semiconductor laser 2 has a cathode 2b connected to one end 3a of a resistor 3. The other end 3b of the resistor 3 is connected to an output terminal 4b of a voltage-controlling amplifier 4.

The voltage-controlling amplifier 4 has a sufficiently quick response such that an output voltage Vout produced therefrom at the output terminal 4b can vary sufficiently quickly in response to a variation in an input voltage Vin applied to an input termial 4a of the amplifier 4. The output voltage Vout serves to draw a light-emitting electric current $i_1$ through the resistor 1, the semiconductor laser 2, and the resistor 3 so that the output voltage Vout will follow the input voltage Vin. The semiconductor laser 2 is energized to emit light by the current $i_1$ flowing therethrough. The input voltage Vin is produced by an amplifier 9a in response to a light quantity command signal Vi supplied thereto.

The other end 5b of the resistor 5 is connected to an output terminal 6b of a current-controlling amplifier 6 to which there are applied an output voltage (feedback voltage) Vf from a light detector 7 that detects the intensity of part of the light emitted by the semiconductor laser 2 and also a reference voltage Vin'. The reference voltage Vin' is generated by an amplifier 9b in response to the light-quantity command signal Vi applied thereto. The current-controlling amplifier 6 serves to draw a control current $i_2$ dependent on the difference between the applied voltages Vf and Vin'.

Each of the amplifiers 9a, 9b has a sufficiently fast response speed.

Assuming that the voltages Vin and Vin' are kept at constant levels to keep the quantity of light emitted from the semiconductor laser 4 at a predetermined level but that the quantity of emitted light becomes smaller due to heating of the semiconductor laser 2 or the like, the driver circuit shown in FIG. 2 operates as described below. When the quantity of emitted light is maintained at a certain level, the voltages Vin' and Vf are the same.

When the quantity of light emitted from the semiconductor laser 2 becomes smaller, the quantity of light detected by the light detector 7 is also smaller, and so is the output voltage (feedback voltage) Vf from the light detector 7, resulting in Vin'−Vf>0. At this time, the current-controlling amplifier 6 reduces the control current $i_2$ by an amount dependent upon the difference: Vin'−Vf. As the control current $i_2$ is reduced, the current $i_1+i_2$ which flows through resistor 1 is also reduced. Therefore, the potential difference between ends 1a and 1b of resistor 1 is lowered. End 1a of resistor 1 is kept at ground potential Vo, and the output terminal 4b of the voltage-controlling amplifier 4 is kept at the fixed potential, Vout. The potential difference between the anode 2a of the semiconductor laser 2 and the output terminal 4b of the voltage-controlling amplifier 4 is thus increased by an amount equal to the reduction in the potential difference between ends 1a and 1b of resistor 1. Accordingly, the light-emitting current $i_1$ is increased which in turn increases the quantity of light emitted from the semiconductor laser 2.

In the event that the quantity of light emitted from the semiconductor laser 2 is reduced, the driver circuit controls the light-emitting current $i_1$ in a manner which increases the quantity of the emitted light. As a result, the quantity of the emitted light is maintained at a certain constant level.

The quantity of light emitted from the semiconductor laser 2 can be varied by varying the value of the light quantity command signal Vi.

When the light quantity command signal Vi is incremented in a stepwise manner, the voltage Vin and Vin' are also incrementally increased in a stepwise manner. In response to a stepwise increment in the input voltage Vin, the output voltage Vout of the voltage-controlling amplifier 4 is quickly decremented in a stepwise manner. In response to a stepwise increment in the input voltage Vin. The potential difference between the ground potential Vo at end 1a of resistor 1 and the output voltage Vout of the voltage-controlling amplifier 4 is therefore incremented in a stepwise manner, and so is the light-emitting current $i_1$. The quantity of light emitted from the semiconductor laser 2 is therefore incremented in a stepwise manner with a quick response speed. Thereafter, the voltages Vin' and Vf are compared to control the control current $i_2$ for maintaining the quantity of the emitted light at the incremented level.

It will be apparent from the above description that the quantity of light emitted from the semiconductor laser 2 can be reduced in the same manner as described above except that the light quantity command signal Vi is decremented.

Since the light-emitting current $i_1$ is directly varied by the voltage-controlling amplifier 4, the response of a variation in the quantity of the emitted light to a change in the light quantity command signal is sufficiently faster than it would have been if the quantity of the emitted light were varied in a stepwise manner only by the current-controlling amplifier 6 (which would be a conventional feedback control process).

FIG. 2A shows a fragment of a driver circuit according to a modification of the first embodiment shown in FIG. 1. FIG. 2B shows an equivalent circuit of the driver circuit shown in FIG. 2A. Those parts which are structurally and functionally identical to those shown in FIG. 1 are denoted by identical reference characters, and will not be described in detail.

The driver circuit illustrated in FIG. 2A includes two semiconductor lasers 2, 2' on a single chip 10 and having a common anode. Of the two semiconductor lasers 2, 2', only the semiconductor laser 2 functions as a normal semiconductor laser for emitting light. The other semiconductor laser 2', is optically disabled by placing a light shield thereon or passing an overcurrent between its anode and cathode. As shown in FIG. 2B, the two semiconductor laser 2, 2' with a common anode have an equivalent common resistor 1. Therefore, the two semiconductor lasers 2, 2' jointly provide a circuit which is functionally equivalent to a corresponding portion o the circuit of the first embodiment shown in FIG. 1. The driver circuit shown in FIG. 2A is made up of a reduced number of parts, compact, and highly reliable in operation because the common resistor 1 is not actually connected as a separate resistor.

Figure 3:
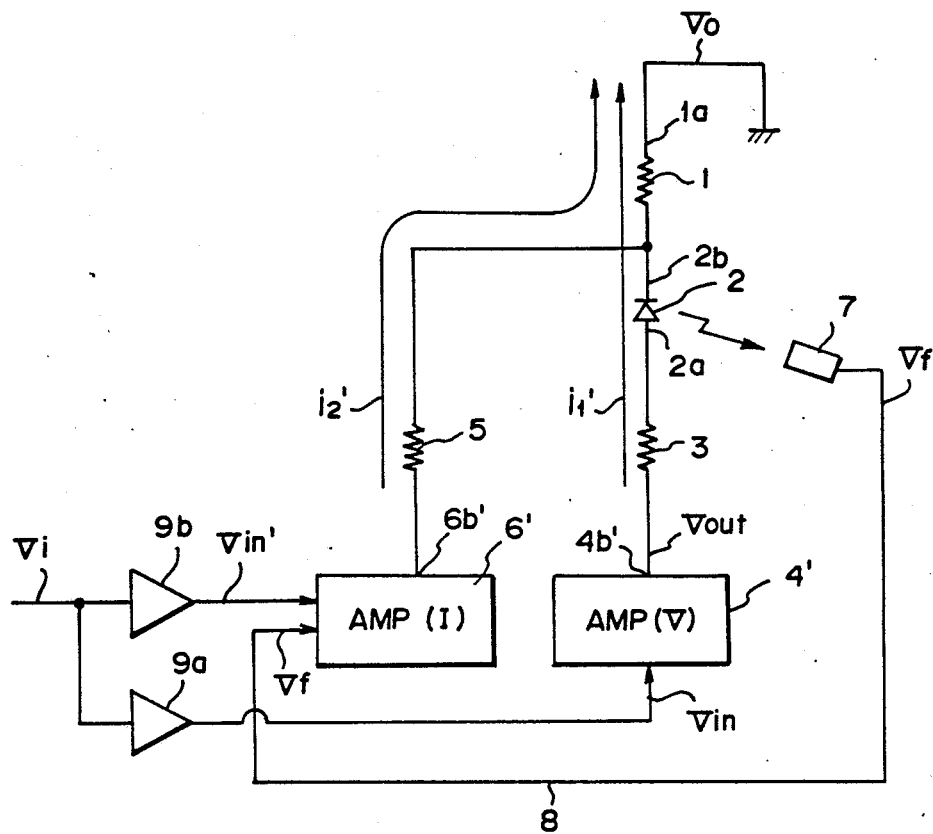
FIG. 3 is a circuit diagram, partly in block diagram form, of a driver circuit according to a second embodiment of the present invention.

FIG. 3 shows a driver circuit according to a second embodiment of the present invention. Those components shown in FIG. 3 which are identical to those shown in FIG. 1 are denoted by identical reference characters.

The driver circuit shown in FIG. 3 differs from the driver circuit of FIG. 1 in that the semiconductor laser 2 is inversely connected, the output voltage Vout of a voltage-controlling amplifier 4' is selected to be higher than the ground potential Vo for causing a light-emitting current $i_1'$ to flow from an output terminal 4b' of the voltage-controlling amplifier 4' to end 1a of resistor 1. A control current $i_2'$ flows from an output terminal 6b' of a current-controlling amplifier 6' toward end 1a of resistor 1.

The other structural and functional details of the driver circuit shown in FIG. 3 are the same as those of the driver circuit of FIG. 1, and will not be described below.

FIG. 4A shows a fragment of a driver circuit according to a modification of the second embodiment shown in FIG. 3. FIG. 4B shows an equivalent circuit of the driver circuit shown in FIG. 4A. Those parts which are structurally and functionally identical to those shown in FIG. 3 are denoted by identical reference characters, and will not be described in detail.

The driver circuit illustrated in FIG. 4A includes two semiconductor lasers 2, 2' on a single chip 10' and having a common anode. Of the two semiconductor lasers 2, 2', only the semiconductor laser 2 functions as a normal semiconductor laser for emitting light. The other semiconductor laser 2' is optically disabled by placing a light shield thereon or passing an overcurrent between its anode and cathode. As shown in FIG. 4B, the two semiconductor lasers 2, 2' with a common anode have an equivalent common resistor 1. Therefore, the two semiconductor lasers 2, 2' jointly provide a circuit which is functionally equivalent to a corresponding portion of the circuit of the second embodiment shown in FIG. 3.

Figure 5:
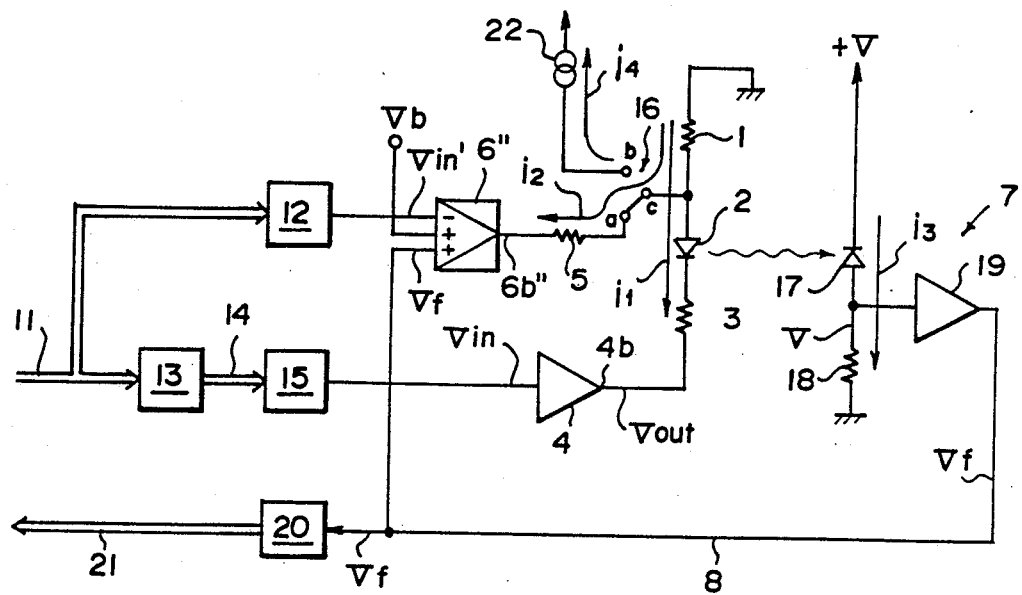
FIG. 5 is a circuit diagram, partly in block diagram form, of a driver circuit according to another modification of the first embodiment.

FIG. 5 shows a driver circuit according to another modification of the first embodiment shown in FIG. 1. Those parts of FIG. 5 which are identical to those of FIG. 1 are designated by identical reference characters, and will not be described in detail.

A light-quantity command signal (digital signal) 11 indicating a quantity of light to be emitted from the semiconductor laser 2 is issued from a control computer (not shown) or the like and applied to a D/A converter 12 and an L/V conversion table 13. The D/A converter 12 converts the applied light-quantity command signal into an analog signal which is applied as a reference voltage Vin' to a current-controlling amplifier 6". A selector switch 16 has two fixed contacts a and b and a single movable contacts c. Normally, the contacts a and c are connected to each other, and the contacts c and b are disconnected from each other. A control current $i_2$ flows through a resistor 1, the selector switch 16, and a resistor 5 into an output terminal 6b" of the current-controlling amplifier 6".

The L/V conversion table 13 converts the applied light-quantity command signal 11 into a voltage command signal 14. The L/V conversion table 13 contains a table or map which stores values of the light-quantity command signal 11 and corresponding values of the voltage command signal 14, as described later on. The voltage command signal 14 is converted by a D/A converter 15 into an analog signal which is applied as an input voltage Vin to the voltage-controlling amplifier 4. The input voltage Vin is then converted into an output voltage Vout by the voltage-controlling amplifier 4. A light-emitting current $i_1$ flows through resistor 1, the semiconductor laser 2, and resistor 3 and is drawn into the output terminal 4b of the voltage-controlling amplifier 4.

When the light-emitting current $i_1$ flows through the semiconductor laser 2, the semiconductor laser 2 emits light, part of which is detected by a photodiode 17. A photocurrent $i_3$ which flows through the photodiode 17, in an amount dependent on the quantity of light detected by the photodiode 17, flows through a resistor 18, developing a voltage V across the resistor 18. The voltage V is applied to an amplifier 19 which amplifies the voltage V with a certain amplification factor and issues a feedback voltage Vf. The photodiode 17, the resistor 18, and the amplifier 19 functionally correspond to the light detector 7 shown in FIG. 1.

The feedback voltage Vf is applied via a feedback path 8 to the current-controlling amplifier 6" and also to an A/D converter 20. The A/D converter 20 converts the applied feedback voltage Vf into a digital detected light-quantity signal 21, and supplies the digital detected light-quantity signal 21 to the control computer.

The driver circuit shown in FIG. 5 is adjusted in the following manner: A suitable table is temporarily written in the L/V conversion table 13. The contacts c and b of the switch 16 are connected to each other, and the contacts c and a are disconnected from each other. An adjusting current $i_4$ flows from a constant-current regulated power supply 22 through resistor 1 and across contacts c and b of the switch 16. The adjusting current $i_4$ is of the same value as the reference value of the control current $i_2$ which flows during normal operation of the driver circuit.

Thereafter, the light-quantity command signal 11 is increased or decreased sufficiently slowly. The light-quantity command signal 11 is applied to the L/V conversion table 13 and converted thereby into a corresponding voltage command signal 14 according to the temporary table in the L/V conversion table 13. The voltage command signal 14 is converted into the output voltage Vout by the D/A converter 15 and the voltage-controlling amplifier 4. Therefore, the quantity of light emitted from the semiconductor laser 2 is slowly increased or decreased. The speed at which the light-quantity command signal 11 is varied is selected such that the quantity of the emitted light can be regarded as being fixed or constant at each point of time during the increase or decrease.

The quantity of light emitted by the semiconductor laser 2 is monitored by the photodiode 17 and converted into the feedback voltage Vf, which is then converted into the digital detected light-quantity signal 21 by the A/D converter 20.

The relationship between the detected light-quantity signal 21 and the voltage command signal 14 is formulated as a table, and the table contained in the L/V conversion table 13 is modified such that when the detected light-quantity signal 21 is applied as the light-quantity command signal 11 to the L/V conversion table 13, the voltage command signal 14 corresponding to the applied light-quantity command signal 11 is issued from the L/V conversion table 13, and the detected light-quantity signal 21 having the same value as that of the light-quantity command signal 11 is issued from the A/D converter 20.

Then, the contacts c and a of the switch 16 are joined to each other, and the contacts c and b are disconnected from each other. Thereafter, a light-quantity command signal 11 is applied and converted into an output voltage Vout through the modified L/V conversion table 13, the D/A converter 15, and the voltage-controlling amplifier 4. A light-emitting current $i_1$ now flows through the semiconductor laser 2 to enable the same to emit light. The light-quantity command signal 11 is also converted by the D/A converter 12 into a reference voltage Vin' which is applied to the current-controlling amplifier 6". The current-controlling amplifier 6" is also supplied with the feedback voltage Vf and a bias voltage Vb. The bias voltage Vb is adjusted such that when Vin'=Vf, the control current $i_2$ is of the same value as that of the adjusting current $i_4$. Thus, the bias voltage Vb is effective in continuously supplying the control current $i_2=i_4$ when Vin'=Vf. When Vin'≠Vf, the control current $i_2$ varies about the value of the adjusting current $i_4$.

With the driver circuit thus adjusted, when the light-quantity command signal 11 is varied subsequently, the quantity of light emitted from the semiconductor laser 2 varies quickly and has a good response so that it quickly follows the light-quantity command signal 11. If the light-quantity command signal 11 remains unchanged, then the quantity of the emitted light is maintained at a prescribed level dependent on the light-quantity command signal 11.

It can readily be understood that the modification of the first embodiment shown in FIG. 5 can easily be combined with the second embodiment shown in FIG. 3.

While the semiconductor laser has been described in each of the above embodiments and modifications, any of various other semiconductor light-emitting devices such as a light-emitting diode may be employed in the illustrated arrangements.

According to the present invention, as described above, the quantity of light emitted by the semiconductor light-emitting device is controlled under feedback control by the current-controlling amplifier, and can be directly varied by the voltage-controlling amplifier. When the value of the light-quantity command signal is varied, the quantity of the emitted light can vary with a sufficiently fast response to follow the light-quantity command signal.

Where a plurality of semiconductor light-emitting devices with a common anode or cathode on one chip are employed, the number of resistors used is reduced, making the driver circuit compact in size.

The present invention is particularly effective in stably controlling the optical output of a semiconductor laser.

Although certain preferred embodiments have been shown and described, it should be understood that many changes and modifications may be made therein without departing from the scope of the appended claims.

We claim:

1. A driver circuit for a semiconductor light-emitting device, comprising:

(i) a first current path comprising a first resistor having one end kept at a predetermined voltage level, a semiconductor light-emitting device having an anode connected to the other end of said resistor, a second resistor having one end connected to the cathode of said semiconductor light-emitting device, and a voltage-controlling amplifier having an output terminal connected to the other end of said second resistor;

(ii) a second current path comprising said first resistor, a third resistor having one end connected to a junction between said other end of said first resistor and said anode of said semiconductor light-emitting device, and a current-controlling amplifier having an output terminal connected to the other end of said third resistor;

(iii) a light detector for monitoring the intensity of light emitted from said semiconductor light-emitting device; and (iv) a feedback path connecting an output terminal of said light detector to an input terminal of said current-controlling amplifier;

(v) said voltage-controlling amplifier drawing a current which enables said semiconductor light-emitting device to emit light so that an output voltage of said voltage-controlling amplifier is of a prescribed value dependent on an input signal applied to the voltage-controlling amplifier;

(vi) said current-controlling amplifier drawing a current corresponding to the difference between an output signal applied from said light detector to said current-controlling amplifier and a reference signal applied to the current-controlling amplifier so that said intensity of light is maintained at a prescribed intensity level.

2. A driver circuit according to claim 1, including a plurality of semiconductor light-emitting devices on a single chip and having a common anode, said anode being kept at said predetermined voltage level, said semiconductor light-emitting devices including first and second semiconductor light-emitting devices, said first current path comprising said first semiconductor light-emitting device, said second resistor, and said voltage-controlling amplifier, one end of said second resistor being connected to the cathode of said first semiconductor light-emitting device, and the other end of said second resistor being connected to said voltage-controlling amplifier, said second current path comprising said second semiconductor light-emitting device, said third resistor, and said current-controlling amplifier, one end of said third resistor being connected to the cathode of said second semiconductor light-emitting device and the other end of said third resistor being connected to said current-controlling amplifier.

3. A driver circuit according to claim 1, wherein said semiconductor light-emitting device or each of said semiconductor light-emitting devices comprises a semiconductor laser.

4. A driver circuit for a semiconductor light-emitting device, comprising:

(i) a first current path comprising a first resistor having one end kept at a predetermined voltage level, a semiconductor light-emitting device having a cathode connected to the other end of said resistor, a second resistor having one end connected to the anode of said semiconductor light-emitting device, and a voltage-controlling amplifier having an output terminal connected to the other end of said second resistor;

(ii) a second current path comprising said first resistor, a third resistor having one end connected to a junction between said other end of said first resistor and said cathode of said semiconductor light-emitting device, and a current-controlling amplifier having an output terminal connected to the other end of said third resistor;

(iii) a light detector for monitoring the intensity of light emitted from said semiconductor light-emitting device; and (iv) a feedback path connecting an output terminal of said light detector to an input terminal of said current-controlling amplifier;

(v) said voltage-controlling amplifier issuing a current which enables said semiconductor light-emitting device to emit light so that an output voltage of said voltage-controlling amplifier is of a prescribed value dependent on an input signal applied to the voltage-controlling amplifier;

(vi) said current-controlling amplifier issuing a current corresponding to the difference between an output signal applied from said light detector to said current-controlling amplifier and a reference signal applied to the current-controlling amplifier so that said intensity of light is maintained at a prescribed intensity level.

5. A driver circuit according to claim 4, including a plurality of semiconductor light-emitting devices on a single chip and having a common cathode, said cathode being kept at said predetermined voltage level, said semiconductor light-emitting devices including first and second semiconductor light-emitting devices, said first current path comprising said first semiconductor light-emitting device, said second resistor, and said voltage-controlling amplifier, one end of said second resistor being connected to the anode of said first semiconductor light-emitting device, and the other end of said second resistor being connected to said voltage-controlling amplifier, said second current path comprising said second semiconductor light-emitting device, said third resistor, and said current-controlling amplifier, one end of said third resistor being connected to the anode of said second semiconductor light-emitting device and the other end of said third resistor being connected to said current-controlling amplifier.

6. A driver circuit according to claim 4, wherein said semiconductor light-emitting device or each of said semiconductor light-emitting devices comprises a semiconductor laser.

7. A driver circuit according to claim 5, wherein said semiconductor light-emitting device or each of said semiconductor light-emitting devices comprises a semiconductor laser.

* * * * *